(12) United States Patent
Tomishima

(10) Patent No.: US 7,385,871 B2
(45) Date of Patent: *Jun. 10, 2008

(54) APPARATUS FOR MEMORY DEVICE WORDLINE

(75) Inventor: Shigeki Tomishima, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/415,726

(22) Filed: May 2, 2006

(65) Prior Publication Data

US 2006/0198232 A1 Sep. 7, 2006

Related U.S. Application Data

(63) Continuation of application No. 10/925,016, filed on Aug. 23, 2004, now Pat. No. 7,046,578.

(51) Int. Cl.
*G11C 8/00* (2006.01)
(52) U.S. Cl. ...... 365/230.06; 365/51; 365/63
(58) Field of Classification Search ...... 365/206
See application file for complete search history.

(56) References Cited

U.S. PATENT DOCUMENTS

| | | | |
|---|---|---|---|
| 5,140,550 A * | 8/1992 | Miyaoka et al. | 365/177 |
| 5,291,432 A * | 3/1994 | Furutani | 365/51 |
| 5,404,338 A * | 4/1995 | Murai et al. | 365/233 |
| 5,583,356 A * | 12/1996 | Yoon et al. | 257/296 |
| 5,587,950 A * | 12/1996 | Sawada et al. | 365/201 |
| 5,587,960 A | 12/1996 | Ferris | |
| 5,761,149 A | 6/1998 | Suzuki et al. | |
| 5,763,908 A * | 6/1998 | Han et al. | 257/208 |
| 5,910,927 A * | 6/1999 | Hamamoto et al. | 365/230.03 |
| 6,330,205 B2 | 12/2001 | Shimizu et al. | |
| 6,504,748 B2 * | 1/2003 | Choi et al. | 365/145 |
| 6,556,503 B2 | 4/2003 | Schreck | |
| 6,953,960 B2 | 10/2005 | Tomishima | |
| 7,046,578 B2 * | 5/2006 | Tomishima | 365/230.06 |

* cited by examiner

*Primary Examiner*—Tan T. Nguyen
(74) *Attorney, Agent, or Firm*—TraskBritt

(57) ABSTRACT

A method and apparatus for improving the speed of a wordline in a memory device. A wordline structure includes a main wordline for selectively distributing a main wordline signal and a plurality of wordlines selectively coupled to the main wordline. Each of the wordlines is selectively coupled to a lower resistivity shared interconnection line by way of a selected one of a plurality of switching elements each commonly coupled on one end to the shared interconnection line and individually coupled on an opposing end to the plurality of wordlines. Each of the plurality of switching elements is selectively activated to couple one of the plurality of wordlines to the shared interconnection line when the main wordline signal is selectively coupled to one of the plurality of wordlines.

21 Claims, 13 Drawing Sheets

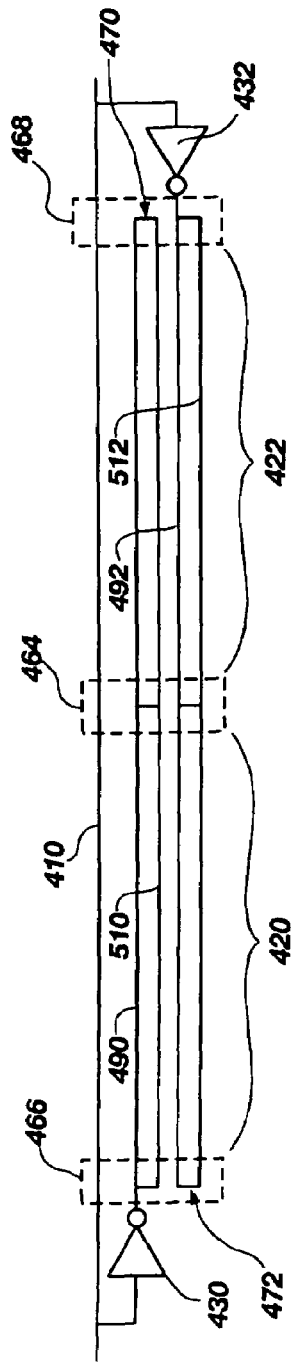
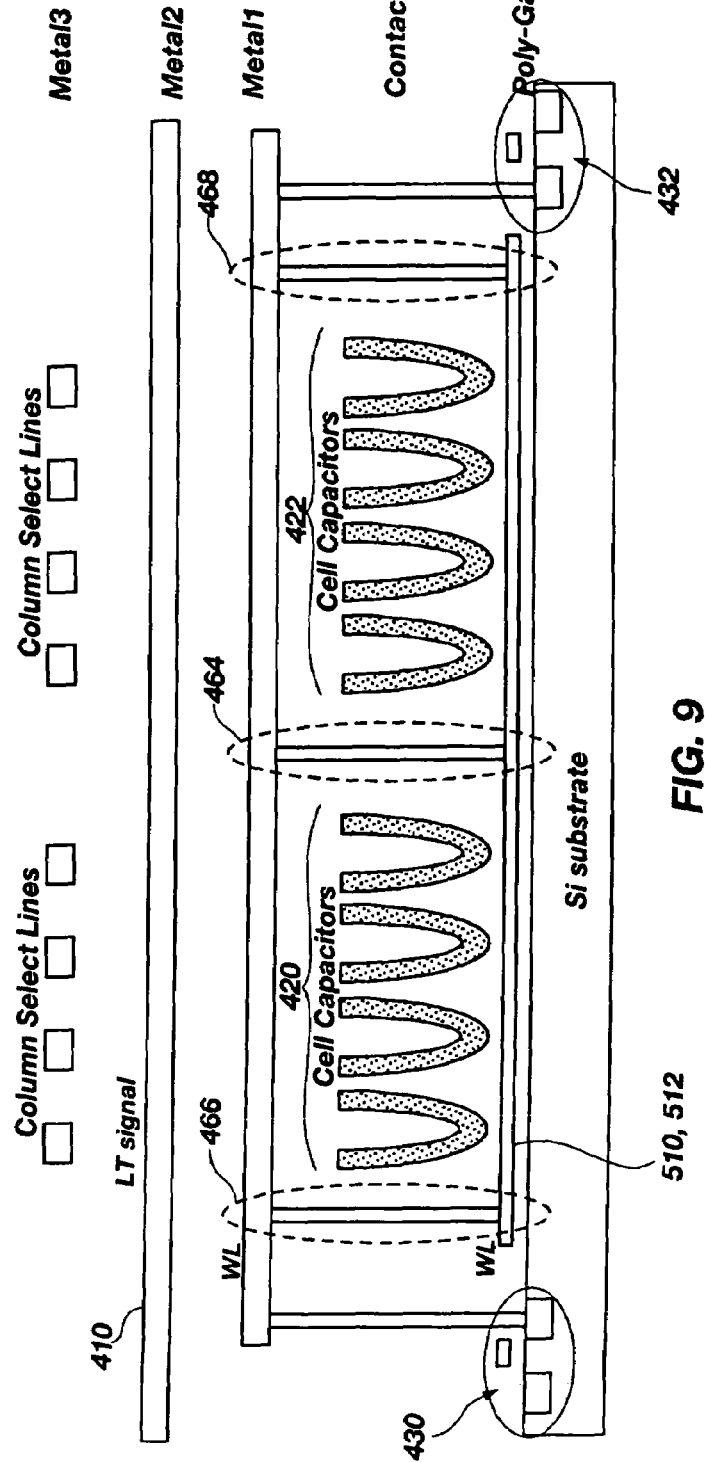

APPARATUS FOR MEMORY DEVICE WORDLINE

CROSS-REFERENCE TO RELATED APPLICATION

This application is a continuation of application Ser. No. 10/925,016, filed Aug. 23, 2004, now U.S. Pat. No. 7,046,578, issued May 16, 2006.

BACKGROUND OF THE INVENTION

1. Field of the Invention

The present invention relates to a semiconductor memory device, and particularly, to a semiconductor memory device of a multilayer metal interconnection structure. Yet more particularly, the present invention relates to a wordline architecture utilizing reduced metallization layers.

2. State of the Art

Memory devices store data in vast arrays of memory cells. Essentially, the cells are located at intersections of wordlines and bitlines with each cell conventionally storing a single bit of data as a logical "1" or a logical "0" and can be individually accessed or addressed. Conventionally, each cell is addressed using two multi-bit numbers. The first multi-bit number, or row address, identifies the row of the memory array in which the memory cell is located. The second multi-bit numeral, or column address, identifies the column of the memory array in which the desired memory cell is located. Each row address/column address combination corresponds to a single memory cell. The row and column addresses are applied to inputs of row and column decoders to access an individual memory cell. Conventionally, row and column decoders are fabricated using programmable logic arrays, wherein these arrays are configured to select desired word and bitlines based on address signals applied to the inputs of the array.

FIG. 1 is a diagram illustrating an arrangement of memory cell regions of a conventional memory device, such as a dynamic random access memory (DRAM) in accordance with a wordline shunt architecture. In FIG. 1, the DRAM includes two memory cell regions, 120 and 122 placed in respective regions on a semiconductor chip. The memory cell regions 120, 122 each have a predefined storage capacity, for example, of 2N total bits. A peripheral circuit 124 is placed in a region adjacent to memory cell regions 120, 122. Peripheral circuit 124 includes a peripheral control circuit (not shown) that controls the operation within memory cell regions 120, 122. By placing the memory cell regions 120, 122 in a plurality of symmetric regions on a semiconductor chip, the length of wordlines and bitlines may be reduced to decrease the time requirement for selection of a memory cell within a memory cell region 120, 122 for the extraction or insertion of data within a respective memory cell.

FIG. 1 is a diagram schematically showing an example of a configuration of memory cell regions 120, 122 wherein each cell region may be configured in a similar arrangement forming smaller subdivided portions of a memory device 100. By way of example, a memory device 100 may be divided into multiple memory cell regions traversed by one or more wordline arrangements 130-144 and further traversed, generally in an opposing direction, by one or more column select lines 150-156. According to the wordline shunt configuration, as presently described, memory device 100 further includes one or more shunt regions 160-164.

Wordline shunt regions 160-164 are regions in which a conductively electrical connection is formed between a highly resistive wordline connected to the gates of corresponding memory cell transistors and a low resistance metal interconnection line 190-204. Interconnection between metal interconnection lines 190-204 with wordlines 170-184 reduces the resistance of wordlines 170-184 thereby enabling a higher speed transmission of a wordline drive signal 210-224 across one or more memory cell regions 120, 122.

FIG. 2 is a schematic showing a configuration of a wordline configured according to a shunt architecture. According to FIG. 2, reference numerals corresponding to a specific wordline arrangement of FIG. 1 are reused for the discussion relating to the current figure. The wordline arrangement 130 includes a wordline drive signal 210 coupled to a wordline driver 230 which is coupled to a low resistivity metal interconnection line 190 which is generally located in parallel to wordline 170. Metal interconnection line 190 and wordline 170 are both coupled to wordline driver 230. Metal interconnection line 190 and wordline 170 are electrically connected in one or more shunt regions 160-164. In each of the memory cell regions 120, 122, the metal interconnection line 190 includes a resistance $R_M$ while the wordline 170 has a resistance $R_P$, wherein the wordline is generally comprised of polysilicon which exhibits a much greater resistance than that of a metal-based interconnection line. It is noted herein that when a higher resistance wordline, such as wordline 170, is driven by a wordline driver 230 physically implemented generally at one end of wordline 170, an appreciable propagation delay arises throughout the length of the wordline 170, particularly at a location along the wordline that is farthest from the wordline driver 230. Such a propagation delay reduces the overall maximum speed of the device, and is therefore undesirable.

The propagation delay along the wordline is improved according to the wordline shunt architecture as presently described through the utilization of a metal interconnection line 190 which is provided in parallel with wordline 170 and electrically connected thereto through contacts occurring in one or more shunt regions 160-164. Therefore, since the higher resistance wordline 170 is coupled in parallel with a lower resistance metal interconnection line 190, the overall reduction in resistance enables the wordline signal to propagate more quickly across the length of the wordline 170.

FIG. 3 illustrates a cross-sectional view of a portion of memory device 100 as illustrated with reference to FIG. 1. As illustrated, the wordline shunt architecture is implemented through the use of two layers of metal interconnections, metal 1 and metal 2, and through the use of a polysilicon layer for forming the wordline for the corresponding memory cells.

One alternative to a wordline shunt architecture configuration of a wordline includes a hierarchical wordline architecture utilized to drive a wordline across at least a portion of a memory device at an even higher speed than the afore-described wordline shunt architecture. FIG. 4 is a diagram illustrating the hierarchy wordline architecture. In FIG. 4, a memory device or at least a portion of a memory device 300 includes a memory cell region 320 divided from other memory cell regions by one or more subword driver regions 360, 362. One or more main wordlines 310, 312 are commonly provided to one or more memory cell regions 320 and are further aligned in, for example, a row direction. One or more wordlines 370-384 are provided in each of the memory cell regions 320 corresponding to respective memory cell rows of a memory cell region 320. The wordlines 370-384 are generally comprised of polysilicon which is of a significantly higher resistivity material than a metallization interconnect. In the respective subword driver regions 360, 362, subword drivers 330-344 are provided generally dispersed alternatively on opposing sides of memory cell region 320.

In the hierarchy wordline architecture, each main wordline 310, 312 corresponds to a corresponding plurality of wordlines 370-384. The main wordlines 310, 312 are formed from low resistive metal interconnection lines. The wordlines are constructed in a hierarchical structure including main wordlines driven by a main wordline driver (not shown) and wordlines driven by subword drivers 330-344. Since individual memory cells are not connected to the main wordlines 310, 312, the resistance and capacitance of the main wordlines 310, 312 remain small, enabling a high speed operation of the main wordlines. Furthermore, the wordlines 370-384 are only provided within a corresponding memory cell region which includes a relatively much smaller number of memory cells thereby creating a smaller load to be driven, allowing the wordlines 370-384 to be driven into a selected state at a much higher speed.

FIG. 5 is a schematic diagram specifically showing the configuration of a hierarchical wordline architecture. In FIG. 5, a subword driver 330 commonly drives a wordline 370 into a selected state corresponding to a main wordline 310. The main wordline 310 includes a low resistance $R_M$ while the wordline 370 includes a higher resistance $R_P$. As shown, the wordlines are organized in hierarchical architecture including a main wordline 310 and wordline 370 with the main wordline 310 formed of a metal interconnection line with a smaller resistance while the wordline 370 is comprised of a higher resistive polysilicon.

FIG. 6 is a cross-sectional view of a hierarchy wordline architecture. As illustrated, the wordline hierarchy architecture is implemented through the use of two layers of metal interconnections, metal 1 and metal 2, and through the use of a polysilicon layer for forming the wordline for the corresponding memory cells.

In order to increase the operating frequency of a memory device by incorporating a hierarchical wordline architecture, the quantity of memory cells traversed by the wordline is reduced. Such a reduction causes a further partitioning of the memory cell region into ever smaller regions which may create a layout inefficiency within a memory array of a memory device. Furthermore, when a memory device incorporates a wordline shunt architecture, a necessity arises to use an interconnection layer different from the main wordline interconnect and the wordline interconnect for use in forming a shunt. The formation of such a shunt generally results in an increased number of metal interconnection layers. Therefore, there is a need to provide a wordline architecture which provides an adequate access rate to the memory device without further burdening the manufacturing processes to include an additional layer, such as an additional metallization layer.

BRIEF SUMMARY OF THE INVENTION

The present invention is directed to a method and apparatus for a memory device wordline. In one embodiment of the present invention, a wordline structure includes a main wordline for selectively distributing a main wordline signal and a plurality of wordlines selectively coupled to the main wordline. Each of the wordlines are selectively coupled to a lower resistivity shared interconnection line by way of a selected one of a plurality of switching elements each commonly coupled on one end to the shared interconnection line and individually coupled on an opposing end to the plurality of wordlines. Each of the plurality of switching elements is selectively activated to couple one of the plurality of wordlines to the shared interconnection line when the main wordline signal is selectively coupled to the one of the plurality of wordlines.

In another embodiment of the present invention, a memory device includes a plurality of memory cells arranged in rows and columns. The memory device further includes a wordline structure configured to activate at least one row of the plurality of memory cells. The wordline structure includes at least one wordline formed to activate at least one row of the plurality of memory cells. A shared interconnection line comprises a lesser resistive material than the one wordline and at least one switching element corresponding to the at least one wordline, and the one switching element is configured to selectively couple the shared interconnection line with a selected one of the one wordline.

In yet another embodiment of the present invention, an electronic system includes an input device, an output device, a memory device, and a processor device coupled to the input, output, and memory device with at least one of the input, output, memory, and processor devices including a semiconductor memory device with a plurality of memory cells arranged in rows and columns and a wordline structure. The wordline structure includes a main wordline for selectively distributing a main wordline signal and a plurality of wordlines selectively coupled to the main wordline. The wordline structure also includes a shared interconnection line and a plurality of switching elements each commonly coupled on one end to the shared interconnection line and individually coupled on an opposing end to the plurality of wordlines, with each of the plurality of switching elements selectively activated to couple one of the plurality of wordlines to the shared interconnection line when the main wordline signal is selectively coupled to the one of the plurality of wordlines.

In yet a further embodiment of the present invention, a semiconductor wafer on which is fabricated a semiconductor memory device that includes a plurality of memory cells arranged in rows and columns and a wordline structure including a main wordline for selectively distributing a main wordline signal and a plurality of wordlines selectively coupled to the main wordline is shown. Also, a shared interconnection line couples to a plurality of switching elements, each commonly coupled on one end to the shared interconnection line and individually coupled on an opposing end to the plurality of wordlines, wherein each of the plurality of switching elements is selectively activated to couple one of the plurality of wordlines to the shared interconnection line when the main wordline signal is selectively coupled to the one of the plurality of wordlines.

In yet a further embodiment of the present invention, a method for activating a row of a plurality of memory cells is provided. At least one of a plurality of wordlines corresponding to a plurality of rows of memory cells is selected and a shared interconnection line is selectively coupled with at least one of the plurality of wordlines during activation of the at least one of a plurality of wordlines.

BRIEF DESCRIPTION OF THE SEVERAL VIEWS OF THE DRAWINGS

In the drawings, which illustrate what is currently considered to be the best mode for carrying out the invention:

FIG. 8 is a schematic illustrating a wordline configured according to a hybrid wordline architecture;

FIG. 9 is a cross-sectional view of a portion of a memory device configured according to a hybrid wordline architecture;

DETAILED DESCRIPTION OF THE INVENTION

Figure 1:
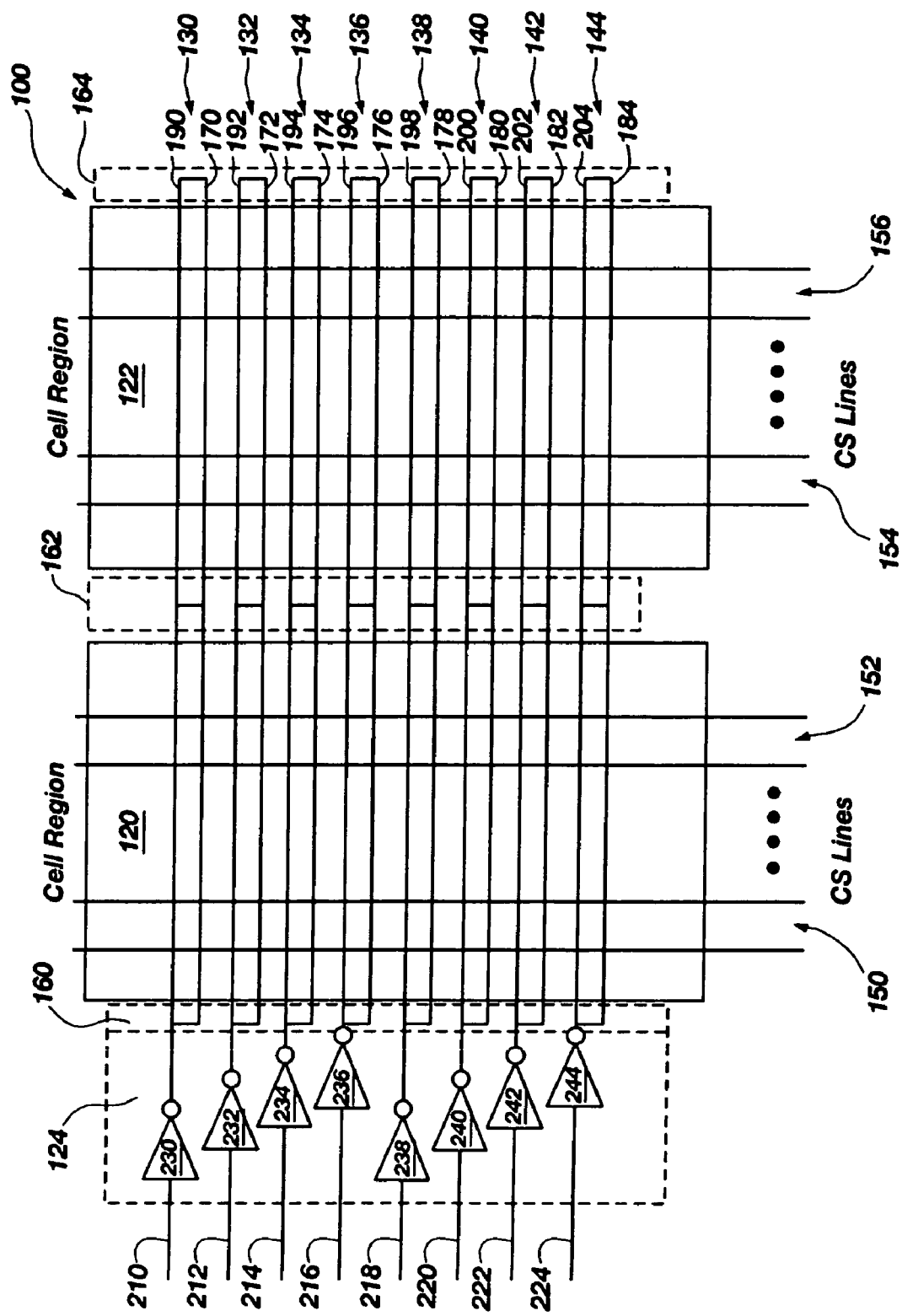
FIG. 1 is a diagram illustrating an arrangement of a portion of a conventional memory device configured according to a wordline shunt architecture, and in accordance with the prior art.
Figure 2:
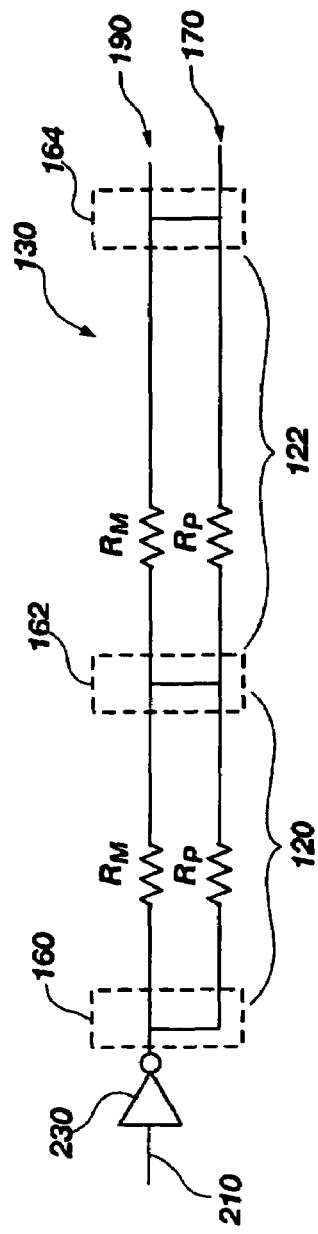
FIG. 2 is a schematic illustrating a wordline configured according to a wordline shunt architecture, in accordance with the prior art.
Figure 3:
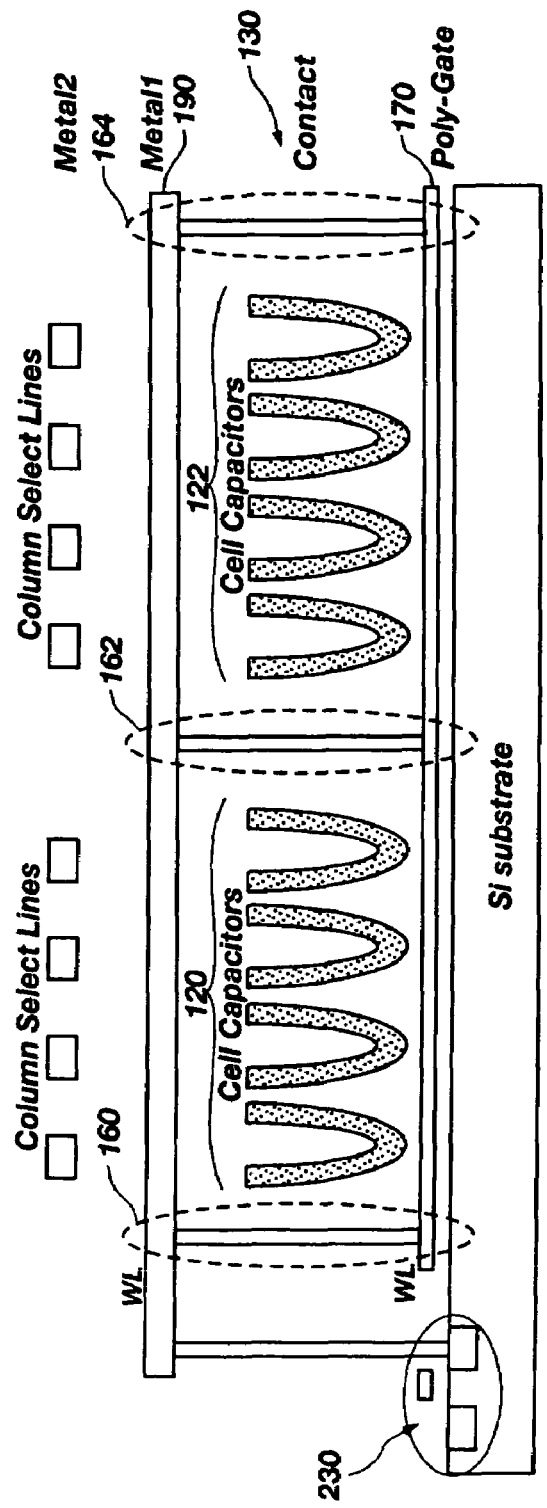
FIG. 3 is a cross-sectional view of a portion of a memory device configured according to a wordline shunt architecture, in accordance with the prior art.
Figure 4:
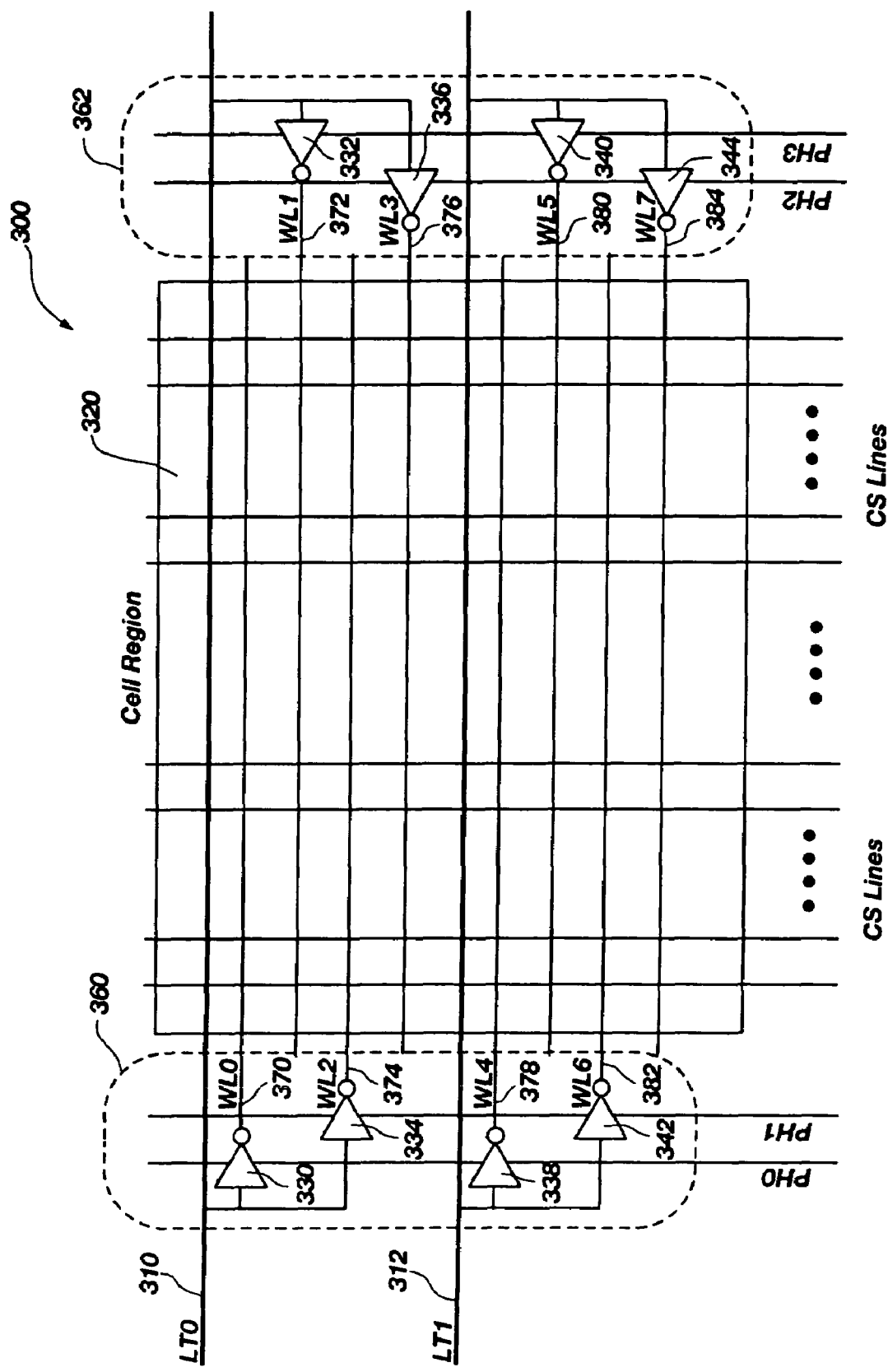
FIG. 4 is a diagram illustrating an arrangement of a portion of a conventional memory device configured according to a hierarchy wordline architecture, and in accordance with the prior art.
Figure 5:
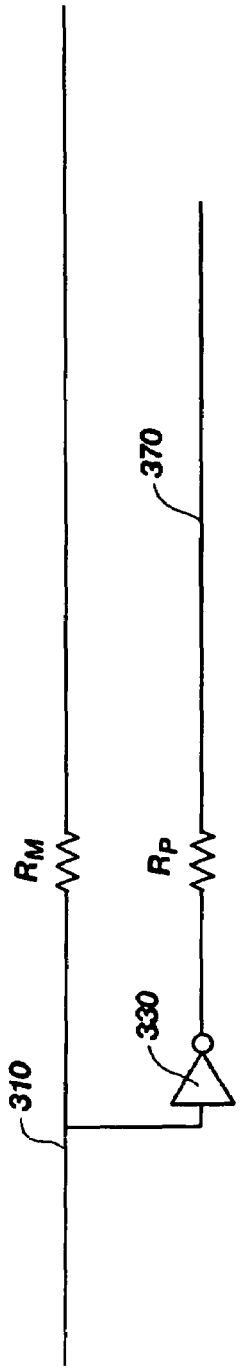
FIG. 5 is a schematic illustrating a wordline configured according to a hierarchy wordline architecture, in accordance with the prior art.
Figure 6:
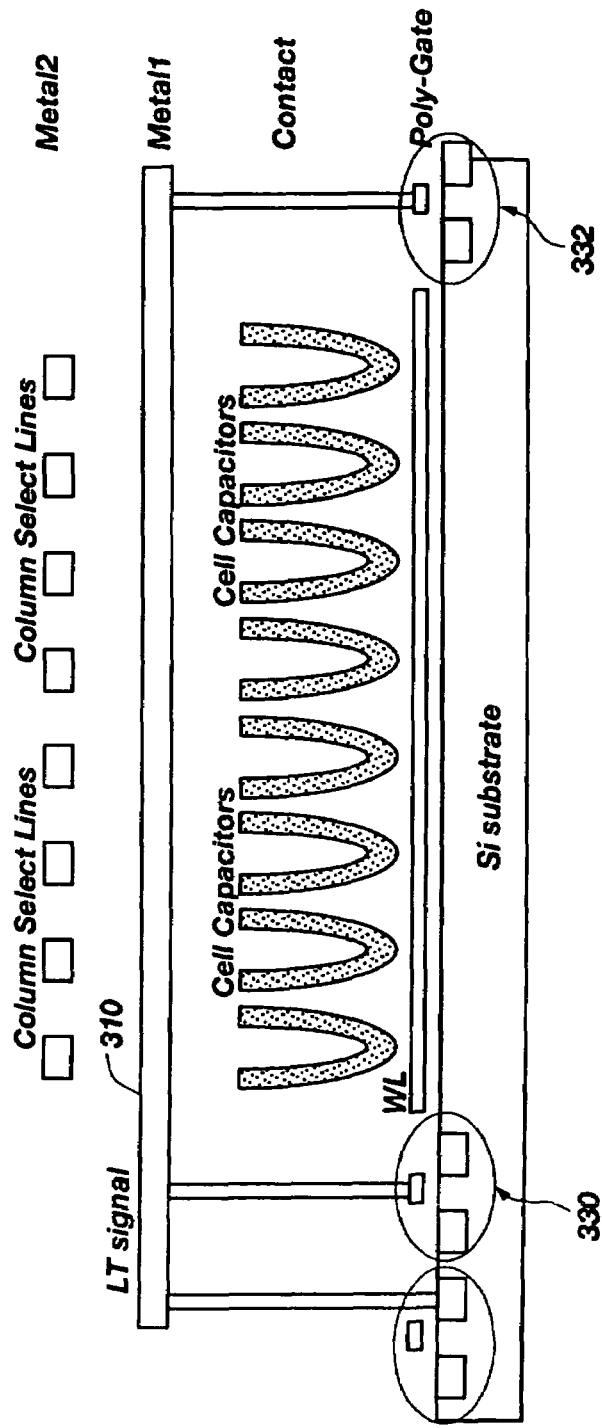
FIG. 6 is a cross-sectional view of a portion of a memory device configured according to a hierarchy wordline architecture, in accordance with the prior art.
Figure 7:
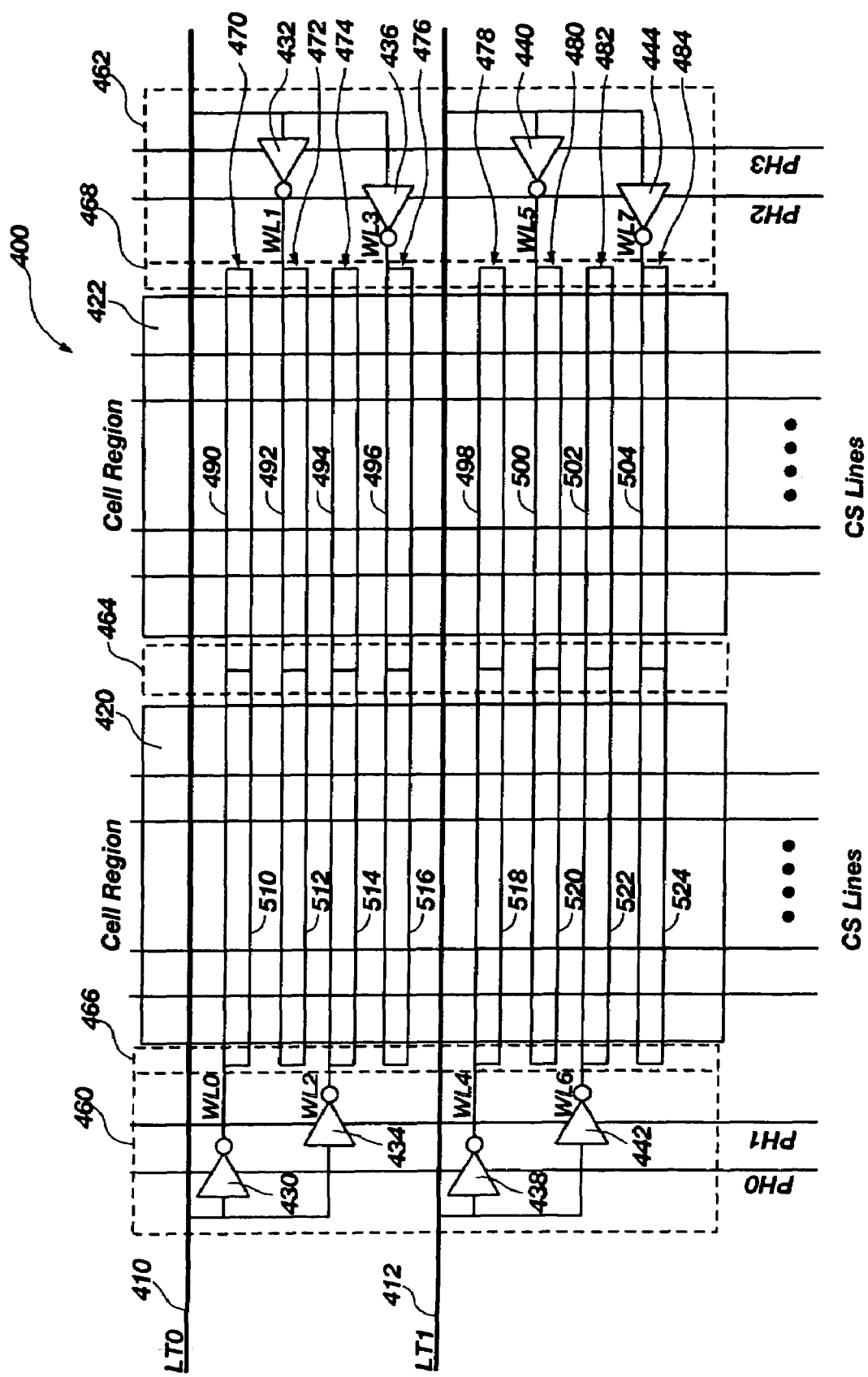
FIG. 7 is a diagram illustrating an arrangement of a portion of a memory device configured according to a hybrid wordline architecture, and in accordance with the present invention.

FIG. 7 illustrates a hybrid wordline architecture which realizes both a shunt configuration and a hierarchy configuration. In the hybrid wordline architecture of FIG. 7, a memory device or at least a portion of a memory device 400 includes memory cell regions 420, 422 divided from other memory cell regions by one or more subword driver regions 460, 462 and one or more shunt regions 464-468. One or more main wordlines 410, 412 are commonly provided to one or more memory cell regions 420, 422 and are further aligned in, for example, a row direction. The hybrid architecture also includes subword drivers 430-444 which are generally dispersed alternatively on opposing sides of memory cell regions 420, 422. The hybrid wordline architecture includes wordline arrangements 470-484 which include a main wordline driver signal received through respective subword drivers 430-444 generating a subwordline coupled to low resistivity metal interconnection lines and are electrically connected in one or more shunt regions 464-468. Through the respective shunts located within shunt regions 464-468, the respective signals coupled to metal interconnection lines 490-504 are electrically coupled to wordlines 510-524. As stated, utilization of shunts within shunt regions 464-468 result in the parallel coupling of a low resistivity metal interconnection line with a higher resistivity, generally polysilicon, wordline thereby reducing the overall effective resistance as seen at the respective wordlines 510-524.

FIG. 8 is a schematic diagram of a wordline configured according to the hybrid wordline architecture. According to FIG. 8, reference numerals corresponding to a specific wordline arrangement of FIG. 7 are reused for discussion relating to the current figure. The wordline arrangements 470, 472 include a signal on a main wordline 410 coupled to subword drivers 430, 432 which are in turn coupled to a low resistivity metal interconnection lines 490, 492, respectively. The metal interconnection lines 490, 492 are generally located in parallel to wordlines 510, 512 and are electrically connected in one or more shunt regions 464-468. The metal interconnection lines 490, 492 and the wordlines 510, 512 span one or more memory cell regions 420, 422.

FIG. 9 illustrates a cross-sectional view of a portion of memory device 400, as illustrated with reference to FIG. 7. As illustrated, the hybrid wordline architecture is implemented through the use of three layers of metal interconnections, metal 1, metal 2 and metal 3, and through the use of a polysilicon layer for forming the wordline for the corresponding memory cells.

Figure 10:
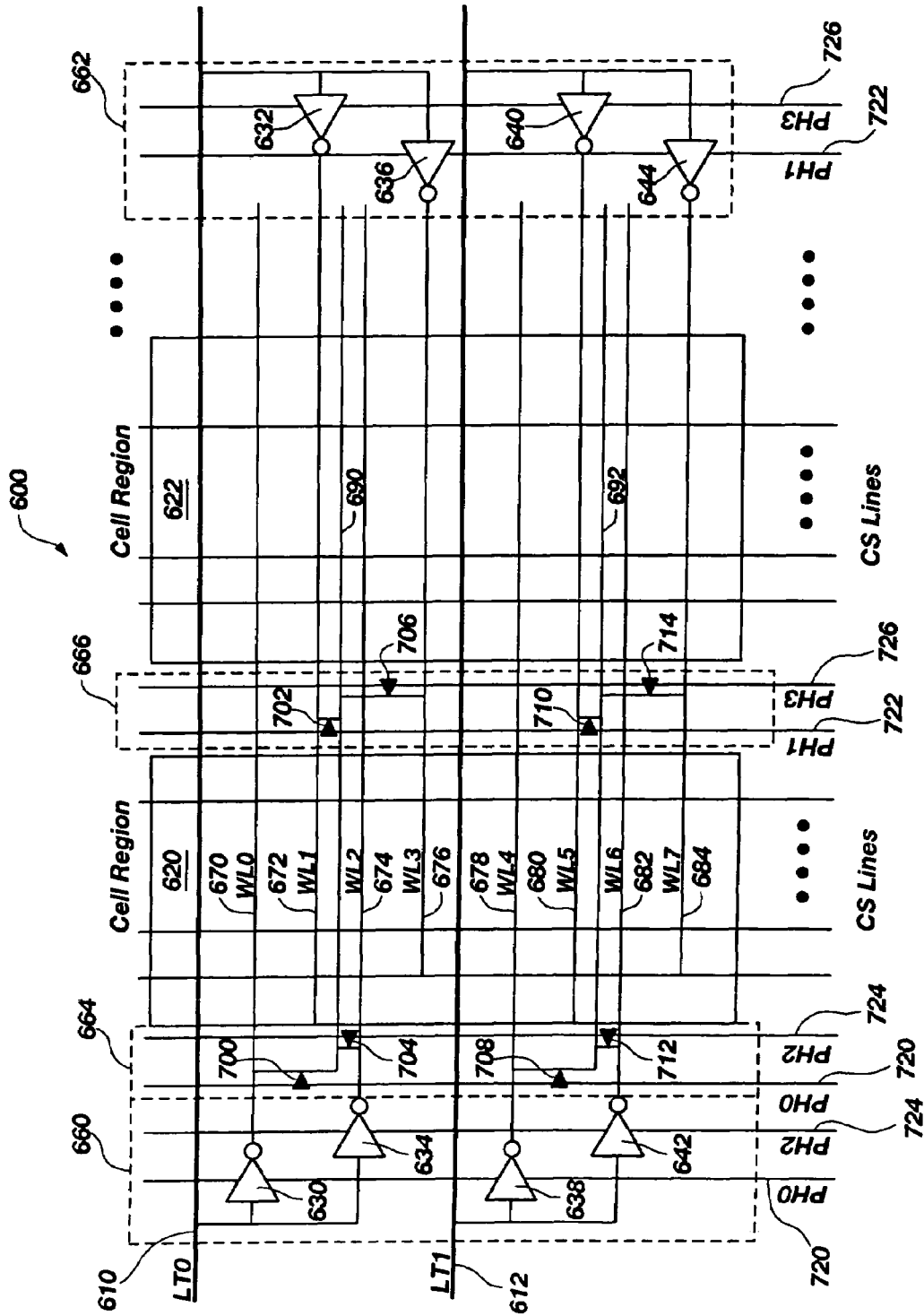
FIG. 10 is a diagram illustrating an arrangement of a portion of a memory device configured according to a switched wordline shunt architecture, and in accordance with an embodiment of the present invention.

FIG. 10 illustrates a switched wordline shunt architecture, in accordance with an embodiment of the present invention. In the switched wordline shunt architecture of FIG. 10, a memory device or at least a portion of memory device 600 includes memory cell regions 620, 622 divided from other memory cell regions by one or more subword driver regions 660, 662 and one or more switched shunt regions 664, 666. One or more main wordlines 610, 612 are commonly provided to one or more memory cell regions 620, 622 and are further aligned in, for example, a row direction. The switched wordline shunt architecture of FIG. 10 also includes subword drivers 630-644 which are generally provided dispersed alternatively on opposing sides of memory cell regions 620, 622. The switched wordline shunt architecture includes a metal interconnection line 690 or 692 shared among a plurality of wordlines 670-676 or 678-684, respectively. In accordance with an embodiment of the present invention, a main wordline driver signal is received on main wordlines 610, 612 through respective subword drivers 630-644 coupled to corresponding wordlines 670-684. A plurality of wordlines may be individually shunted to a lower resistivity metal interconnection line 690, 692 through switching elements 700-714 located within one or more switched shunt regions 664, 666. Switching elements 700-714 are individually controlled by one or more various phase signals 720-726 which are further used to control the subword drivers 630-644 coupled to corresponding wordlines 670-684. Generally speaking, a phase signal 720-726 activates a subword driver 630-644 and also activates a corresponding switching element 700-714 for coupling the lower resistivity metal interconnection line 690, 692 with the corresponding wordline 670-684 to reduce the overall resistivity along the wordline thereby enhancing the speed of performance of the corresponding wordline.

Figure 11:
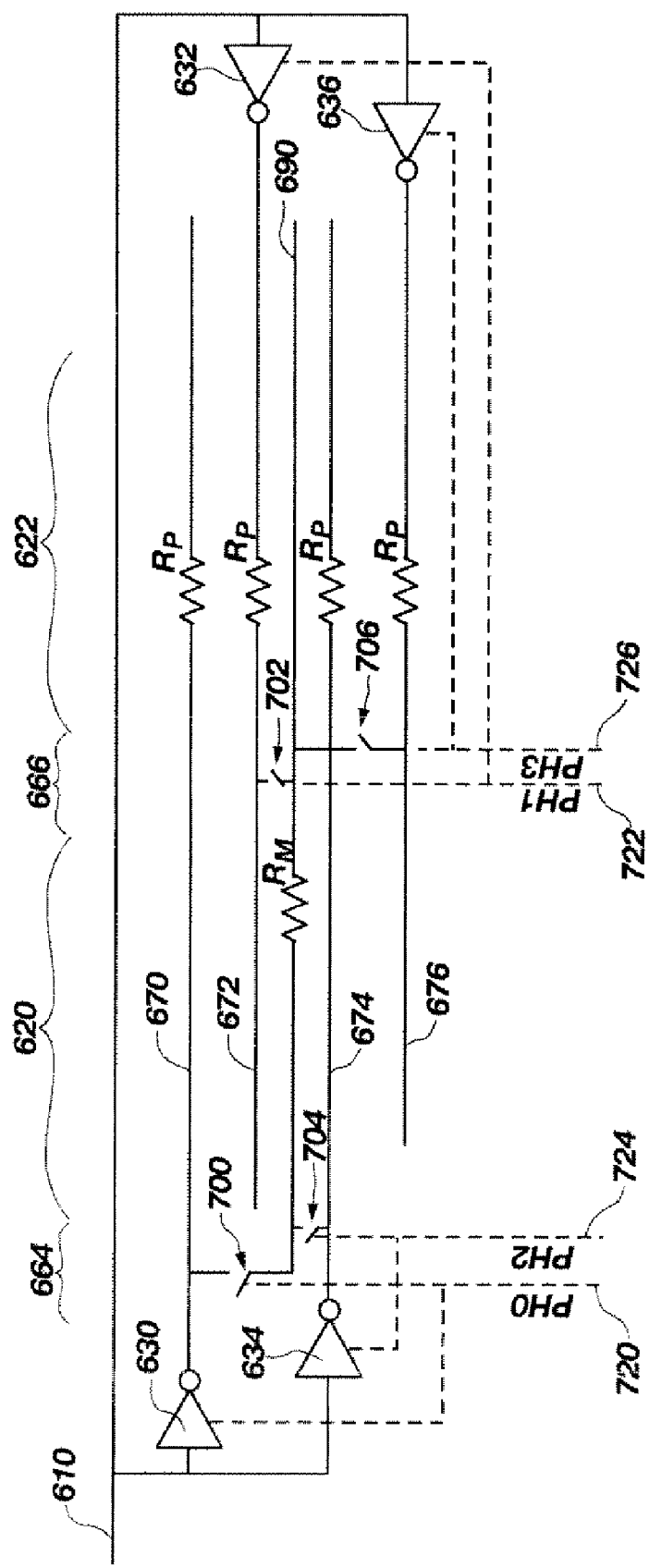
FIG. 11 is a schematic illustrating a wordline configured according to a switched wordline shunt architecture, and in accordance with an embodiment of the present invention.

FIG. 11 is a schematic diagram of a switched wordline shunt architecture, according to an embodiment of the present invention. According to FIG. 11, reference numerals corresponding to a specific switched wordline shunt architecture of FIG. 10 are reused for discussion relating to the current figure. A switched wordline shunt architecture includes a metal interconnection line 690 which is shared among the plurality of wordlines 670-676. Metal interconnection line 690 is located generally in parallel with each of the wordlines 670-676 and are coupled thereto according to the activation of one or more of switching elements 700-706. Furthermore, metal interconnection line 690 exhibits a resistance $R_M$ while each of the wordlines 670-676 exhibits a much larger resistance characteristic of, for example, a polysilicon trace wherein the resistance is illustrated in FIG. 11 as $R_P$. During operation when one or more switching elements 700-706 are activated, the lower resistance metal interconnection layer 690 is coupled in parallel with one or more of the selected wordlines 670-676 causing the overall resistance of the corresponding wordline to be reduced.

Figure 12:
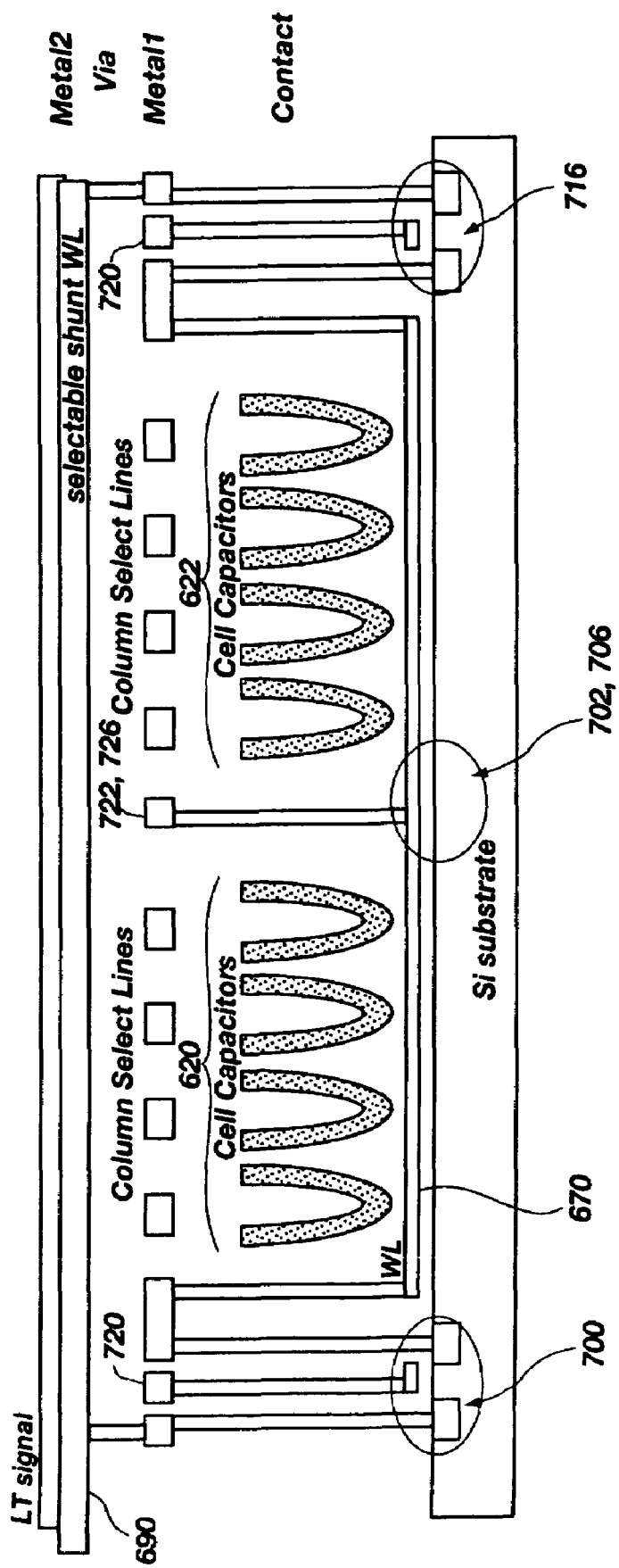
FIG. 12 is a cross-sectional view of a portion of a memory device configured according to a switched wordline shunt architecture, and in accordance with an embodiment of the present invention.

FIG. 12 illustrates a switched wordline shunt architecture as embodied in a portion of a memory device, in accordance with an embodiment of the present invention. According to FIG. 12, reference numbers corresponding to reference numbers of FIGS. 10-11 are reused to illustrate the corresponding relationship. In the present illustration, a metal interconnection line 690 couples to a switching element 700 which is gated by a phase signal 720 which, when activated, results in the electrical coupling of metal interconnection line 690 with wordline 670. Furthermore, as illustrated with reference to FIG. 12, when the arrangement of memory cell region 620, 622 are repetitive, the shared metal interconnection line 690 may be shunted in various stepped areas, as illustrated by a second switching element 716 also gated according to the same phase signal 720. While FIG. 12 illustrates a single wordline arrangement, namely a selectable shunt metal interconnection line 690 and a specific one of wordline 670, other wordlines, such as wordlines 672-676 of FIG. 10 may also be selectably shunted to metal interconnection line 690 when activated by the respective signals. Such switching may occur according to switching elements 702, 706 under the direction of phase signals 722, 726.

Figure 13:
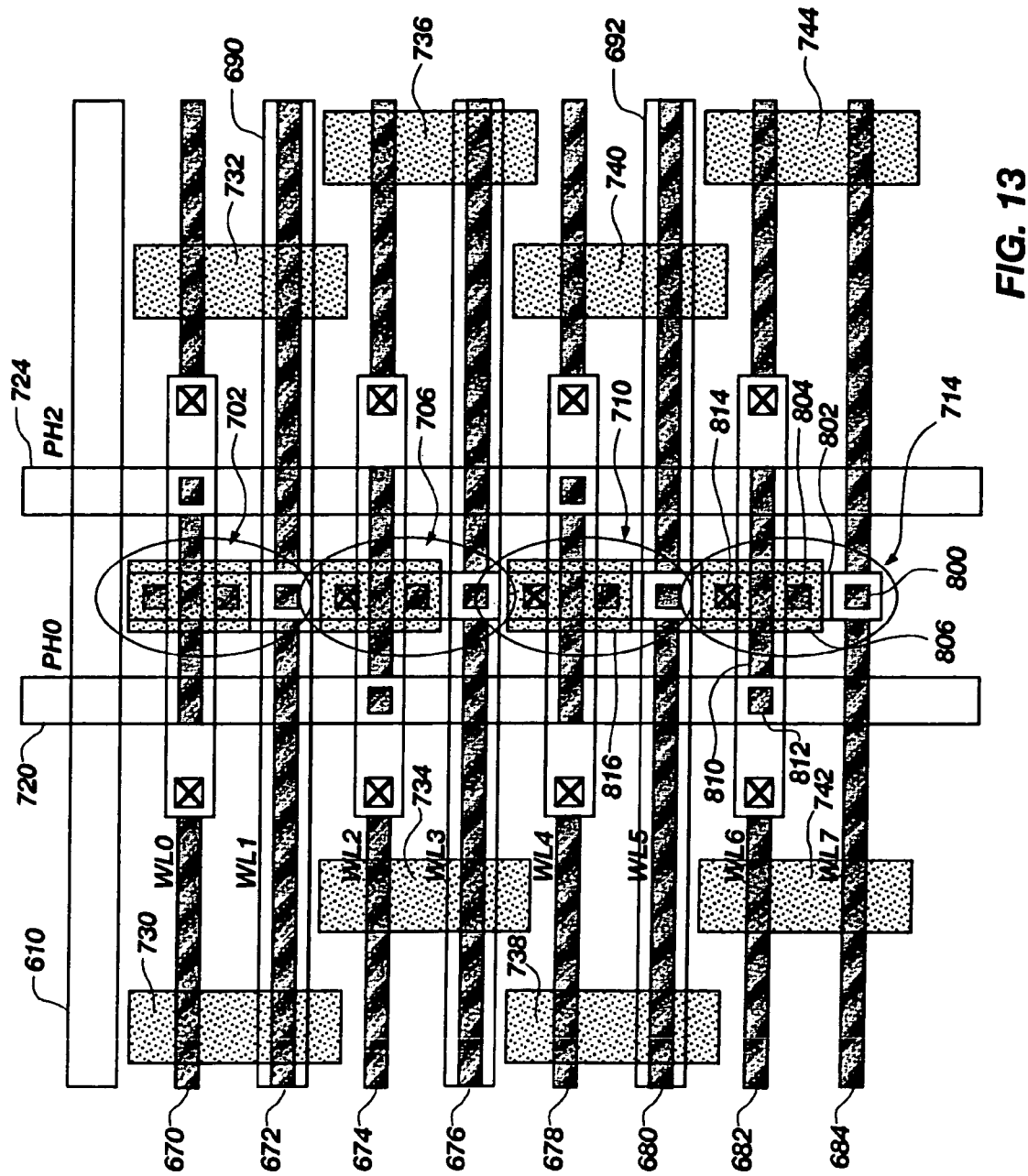
FIG. 13 is a layout diagram of a portion of a memory device configured according to a switched wordline shunt architecture, and in accordance with an embodiment of the present invention.

FIG. 13 illustrates a layout diagram of a switched wordline shunt configuration, in accordance with an embodiment of the present invention. Reference numerals corresponding to previously identified elements of FIGS. 10-12 are reused herein to identify corresponding elements. A plurality of wordlines 670-684 is formed preferably in a row-like manner for conducting electrical signals to memory cell regions 730-744 for causing an activation of a specific memory cell or cells. Wordlines 670-684 are generally comprised of a higher resistivity material, such as polysilicon. Main wordlines 610, 612 provide corresponding main wordline signals for selective activation.

In order to couple the selected wordline to a lower resistivity line to reduce the overall resistance along the wordline thereby increasing the speed, one or more switching elements 702, 706, 710, 714 are selectively activated to couple the selected wordline with a shared interconnection line 690, 692. The switching element 702 is configured for coupling wordline WL1 672 with shared interconnection line 690 upon activation by a switch activation signal, illustrated herein as phase signal 724. The switching element 706 is configured for coupling wordline WL3 676 with shared interconnection line 690 upon activation by a switch activation signal, illustrated herein as phase signal 720. The switching element 710 is configured for coupling wordline WL5 680 with shared interconnection line 692 upon activation by a switch activation signal, illustrated herein as phase signal 724. The switching element 714 is configured for coupling wordline WL7 684 with shared interconnection line 692 upon activation by a switch activation signal, illustrated herein as phase signal 720.

The specific topology of an exemplary switching element 714 which couples wordline WL7 to shared interconnection line 692 includes a wordline WL7 684 fabricated, for example, of a polysilicon material having a higher resistivity than a metallization interconnect. A contact 800 couples wordline 684 to a first metal layer 802 which, through a contact 804, couples to an active area 806 forming, for example, a drain portion of a gate. A poly material forms a gate 810 which is controlled by phase signal 720 through contact 812. A source terminal is formed in the active area 806 with a contact 814 through the first metal layer 802 and up to the second metal layer 816. The second metal layer 816 is then electrically integral with the shared interconnection line 692. Such a gating structure allows for the selective coupling of a higher resistivity wordline with a shared shunt interconnection line having a reduced resistivity. The other switching elements are similarly configured.

Figure 14:
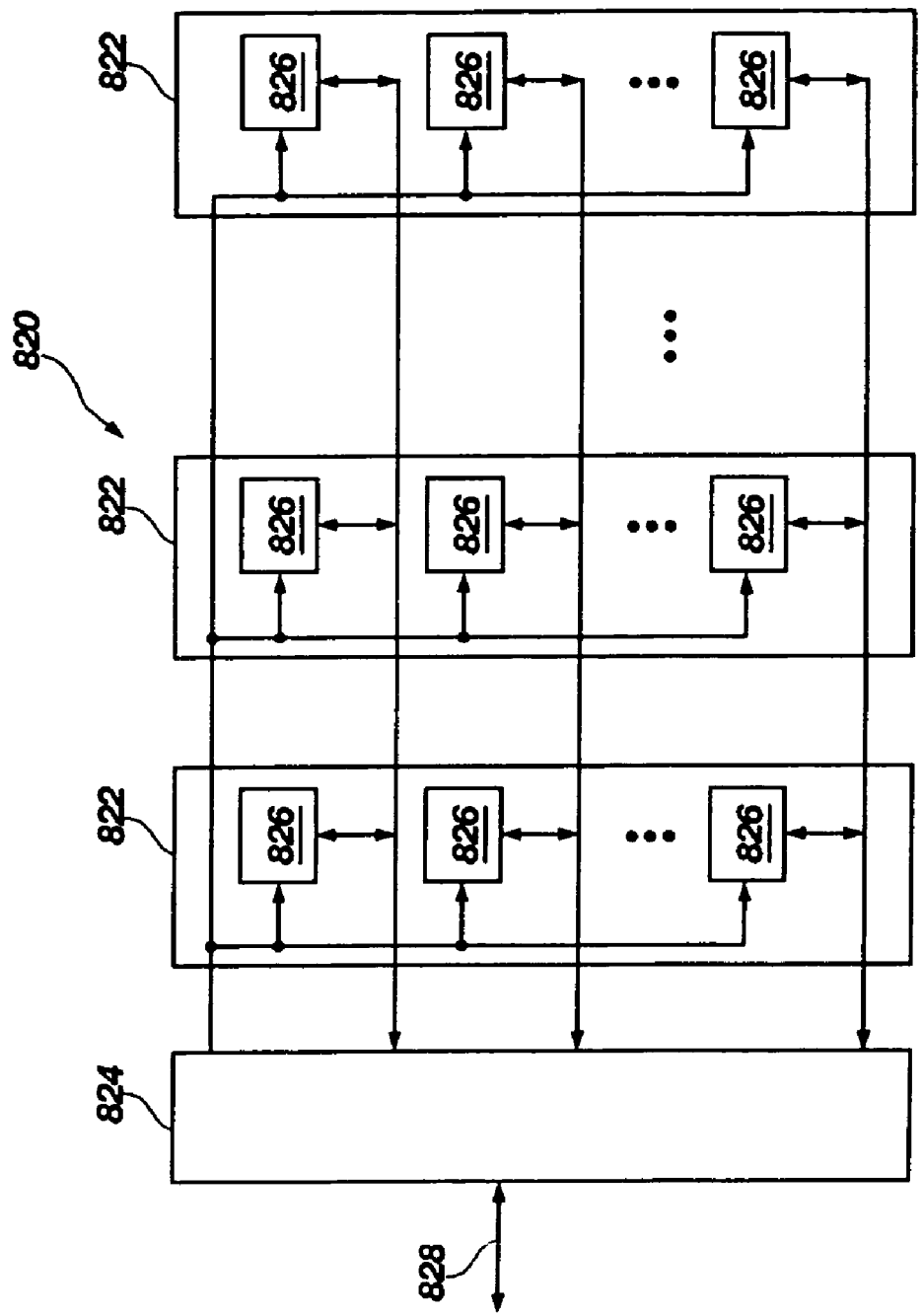
FIG. 14 is a block diagram of a system containing a memory device, according to an embodiment of the present invention.

FIG. 14 is a block diagram of a system, in accordance with an embodiment of the present invention. Memory system 820 contains one or more memory modules 822 and a memory controller 824. Each memory module 822 includes at least one memory device 826. Memory controller 824 provides and controls a bidirectional interface between memory system 820 and an external system bus 828. Memory system 820 accepts a command signal from the external bus 828 and relays it to the one or more memory modules 822. Memory system 820 provides for data input and data output between the one or more memory modules 822 and the external system bus 828. At least one of the memory devices 826 includes a wordline configured according to the switched wordline shunt architecture described hereinabove and as described in the various embodiments of the present invention.

Figure 15:
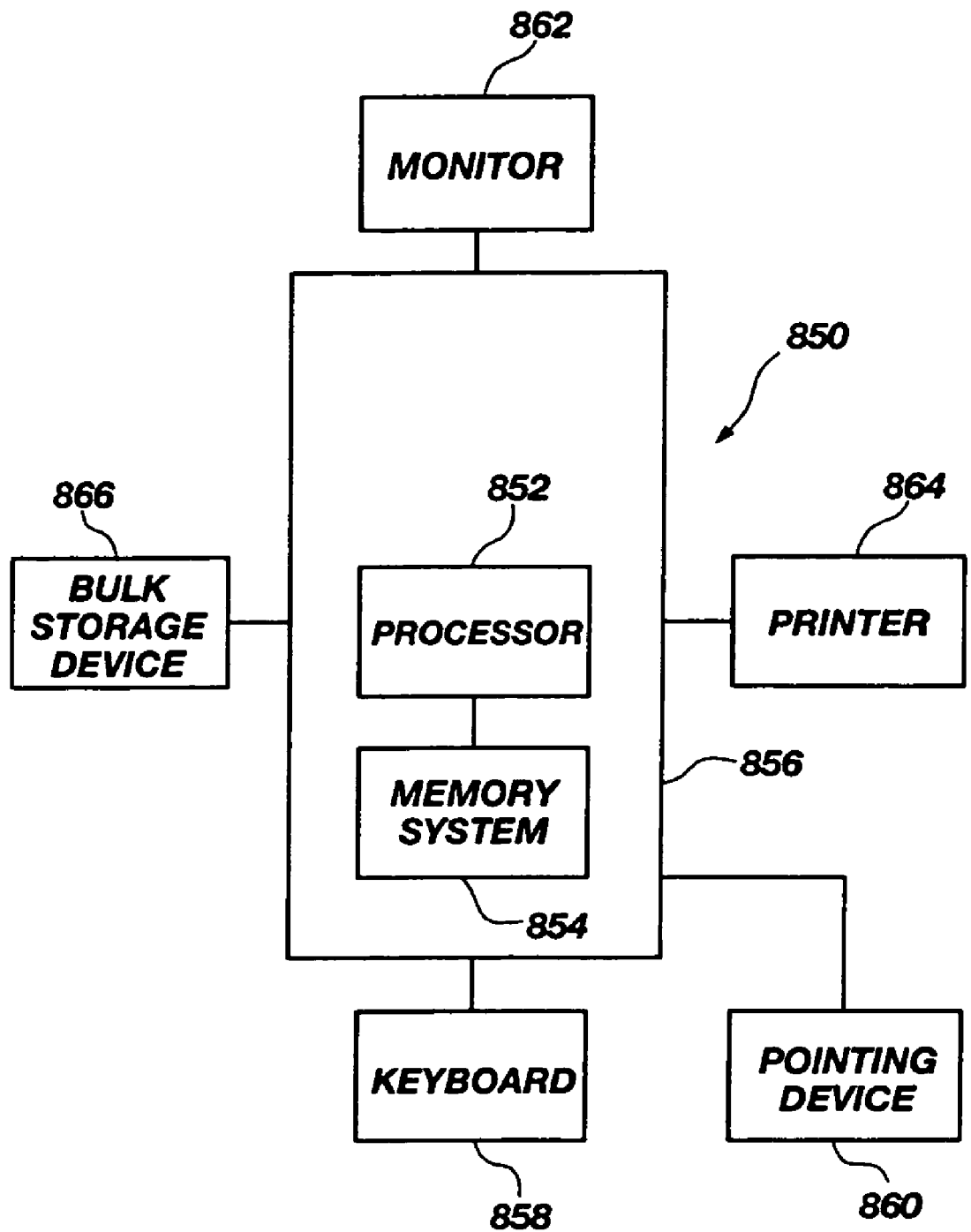
FIG. 15 is a block diagram of a system containing a memory device, according to an embodiment of the present invention.

FIG. 15 is a block diagram of a system, in accordance with an embodiment of the present invention. A system 850 includes a processor 852 and a memory system 854 housed in a unit 856. System 850 is but one example of an electronic system containing another electronic system, e.g., memory system 854, as a component. The system 854 includes a memory device that includes a wordline configured according to the switched wordline shunt architecture described hereinabove, and in accordance with the various embodiments of the present invention. System 850 optionally contains user interface components including a keyboard 858, a pointing device 860, a monitor 862, a printer 864, and a bulk storage device 866. It will be appreciated that other components may also be included such as modems, driver cards, and additional storage devices. It is further appreciated that the processor 852 and memory system 854 of system 850 may be incorporated on a single integrated circuit. Any of these components of the system may include a memory device that includes a wordline configured according to the switched wordline shunt architecture as described hereinabove and as described in the various embodiments of the present invention.

Figure 16:
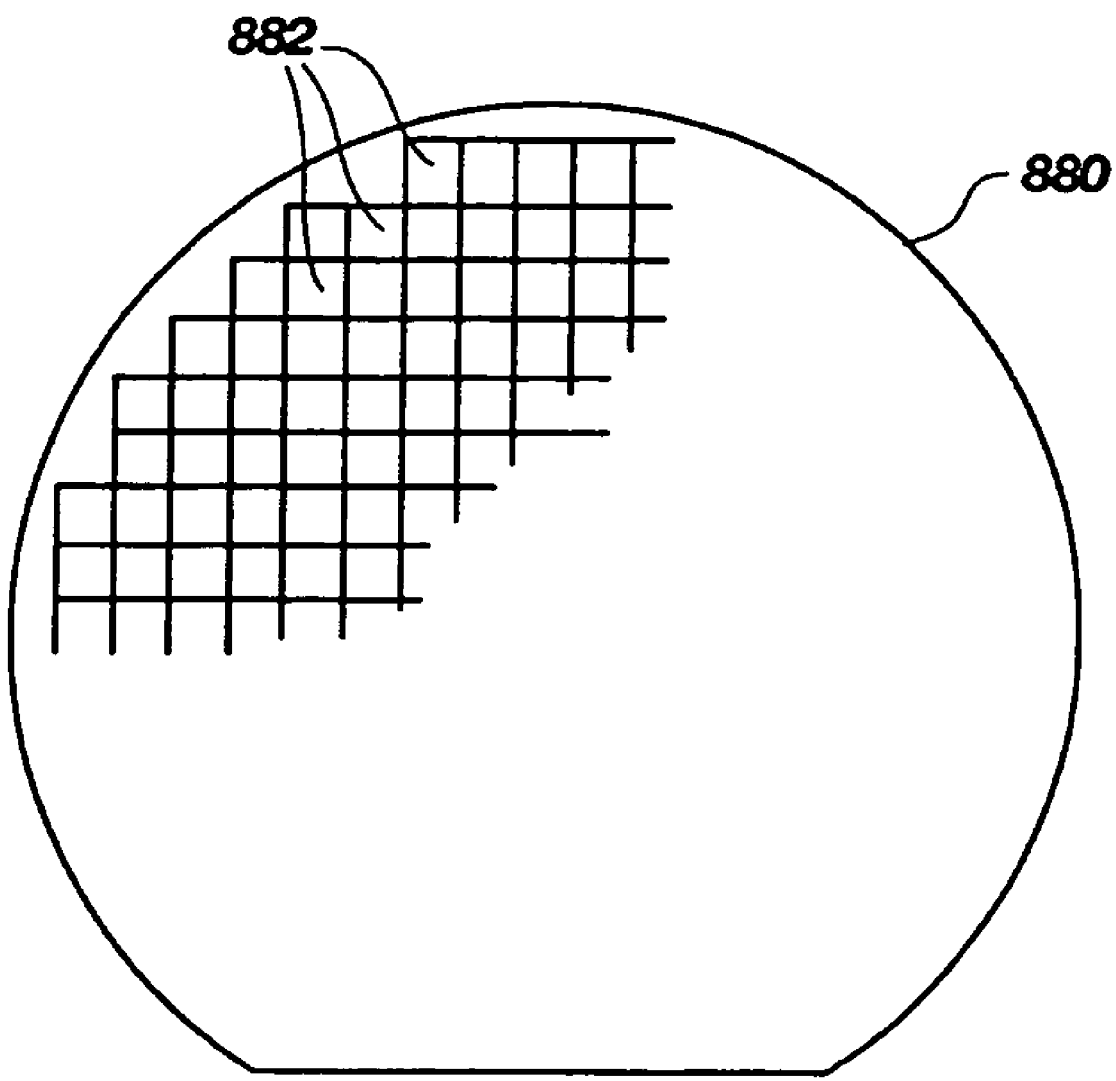
FIG. 16 illustrates a semiconductor wafer containing a memory device configured according to the switched wordline shunt architecture, in accordance with an embodiment of the present invention.

Memory devices of those described herein may be generally fabricated on a wafer as an integrated circuit containing a variety of semiconductor devices as shown in FIG. 16. The integrated circuit is supported by a substrate 880 with the integrated circuits 882 being typically repeated multiple times on each substrate 880. The substrate is further processed to separate the integrated circuits into dies as is well known in the art.

What is claimed is:

1. A wordline structure, comprising:
   a plurality of wordlines; and
   a shared interconnection line for selectively electrically coupling in parallel with at least one of the plurality of wordlines when a main wordline is selectively coupled to at least one of the plurality of wordlines.

2. The wordline structure of claim 1, further comprising a main wordline for selectively distributing a main wordline signal and wherein each of the plurality of wordlines is selectively coupled to the main wordline.

3. The wordline structure of claim 2, further comprising a plurality of switching elements, each commonly coupled on one end to the shared interconnection line and individually coupled on an opposing end to the plurality of wordlines, each of the plurality of switching elements adapted to be selectively activated to couple one of the plurality of wordlines to the shared interconnection line when the main wordline signal is selectively coupled to the one of the plurality of wordlines.

4. The wordline structure of claim 3, further comprising a plurality of subword drivers each including an input and an output adapted to be selectively activated, each input being coupled to the main wordline.

5. The wordline structure of claim 4, wherein the plurality of subword drivers and the plurality of switching elements are selectable according to phase signals.

6. The wordline structure of claim 3, wherein the main wordline and the shared interconnection line are formed from a single metallization layer.

7. The wordline structure of claim 3, wherein the shared interconnection line exhibits a lower resistivity than one of the plurality of wordlines.

8. A memory device, comprising:
   a plurality of memory cells arranged in rows and columns; and
   a wordline structure configured to activate at least one row of the plurality of memory cells, the wordline structure including:
      a plurality of wordlines; and
      a shared interconnection line for selectively electrically coupling in parallel with at least one of the plurality of wordlines when a main wordline is selectively coupled to at least one of the plurality of wordlines.

9. The memory device of claim 8, the wordline structure further comprising a main wordline for selectively distributing a main wordline signal and wherein each of the plurality of wordlines is selectively coupled to the main wordline.

10. The memory device of claim 9, the wordline structure further comprising a plurality of switching elements, each commonly only coupled on one end to the shared interconnection line and individually coupled on an opposing end to the plurality of wordlines, each of the plurality of switching elements adapted to be selectively activated to couple one of the plurality of wordlines to the shared interconnection line when the main wordline signal is selectively coupled to the one of the plurality of wordlines.

11. The memory device of claim 10, wherein the shared interconnection line includes a resistance less than the at least one wordline.

12. The memory device of claim 10, wherein the wordline structure comprises first and second metal layers.

13. The memory device of claim 10, further comprising at least one column select signal for selecting a specific column of the plurality of memory cells.

14. The memory device of claim 13, wherein the at least one column select signal is fabricated in a first metal layer and the shared interconnection line is fabricated in a second metal layer.

15. The memory device of claim 10, wherein the at least one switching element activates according to a selected phase signal.

16. The memory device of claim 15, wherein the at least one switching element comprises a semiconductor gate controlled by the selected phase signal.

17. The memory device of claim 10, wherein the at least one switching element is adapted to selectively electrically couple the shared interconnection line with a selected one of the at least one wordline according to a two layer metallization process.

18. The memory device of claim 10, wherein the main wordline and the shared interconnection line are formed from a single metallization layer.

19. An electronic system comprising an input device, an output device, a memory device, and a processor device coupled to the input, output, and memory devices, at least one of the input, output, memory, and processor devices including a semiconductor memory device, comprising:
   a plurality of memory cells arranged in rows and columns; and
   a wordline structure including:
      a plurality of wordlines; and
      a shared interconnection line for selectively electrically coupling in parallel with at least one of the plurality of wordlines when a main wordline is selectively coupled to at least one of the plurality of wordlines.

20. The electronic system of claim 19, the wordline structure further comprising a main wordline for selectively distributing a main wordline signal and wherein the plurality of wordlines are selectively coupled to the main wordline.

21. The electronic system of claim 20, the wordline structure further comprising a plurality of switching elements, each commonly coupled on one end to the shared interconnection line and individually coupled on an opposing end to the plurality of wordlines, each of the plurality of switching elements adapted to be selectively activated to couple one of the plurality of wordlines to the shared interconnection line when the main wordline signal is selectively coupled to the one of the plurality of wordlines.

* * * * *

UNITED STATES PATENT AND TRADEMARK OFFICE
CERTIFICATE OF CORRECTION

| | | |
|---|---|---|
| PATENT NO. | : 7,385,871 B2 | |
| APPLICATION NO. | : 11/415726 | |
| DATED | : June 10, 2008 | |
| INVENTOR(S) | : Tomishima | |

It is certified that error appears in the above-identified patent and that said Letters Patent is hereby corrected as shown below:

In column 9, line 60, in Claim 10, after "commonly" delete "only".

Signed and Sealed this

Twelfth Day of August, 2008

JON W. DUDAS
*Director of the United States Patent and Trademark Office*